(12) United States Patent
Manganaro

(10) Patent No.: US 6,778,121 B2
(45) Date of Patent: Aug. 17, 2004

(54) HIGH LINEARITY DIGITAL-TO-ANALOG CONVERTER

(75) Inventor: Gabriele Manganaro, Boxborough, MA (US)

(73) Assignee: Engim, Inc., Acton, MA (US)

(*) Notice: Subject to any disclaimer, the term of this patent is extended or adjusted under 35 U.S.C. 154(b) by 0 days.

(21) Appl. No.: 10/462,086

(22) Filed: Jun. 13, 2003

(65) Prior Publication Data

US 2004/0008133 A1 Jan. 15, 2004

Related U.S. Application Data

(60) Provisional application No. 60/389,076, filed on Jun. 13, 2002.

(51) Int. Cl.[7] .................................................. H03M 1/66
(52) U.S. Cl. ..................................... 341/150; 341/144
(58) Field of Search ................................. 341/144, 150

(56) References Cited

U.S. PATENT DOCUMENTS

| | | | | | |
|---|---|---|---|---|---|
| 4,468,654 | A | * | 8/1984 | Kapral | ........................ 341/150 |
| 4,521,762 | A | * | 6/1985 | Kapral | ........................ 341/122 |
| 5,719,576 | A | * | 2/1998 | Draxelmayr | ................ 341/150 |
| 6,570,519 | B1 | * | 5/2003 | Yang | ........................... 341/143 |

OTHER PUBLICATIONS

Bugeja, A. R., et al., "A 14–b, 100–MS/s CMOS DAC Designed for Spectral Performance," IEEE, J. Solid–State Circuits, 34(12): 1719–1732 (1999).

Bugeja, A. R., et al., "A Self–Trimming 14–b 100 MS/s CMOS DAC," IEEE, J. Solid–State Circuits, 35(12): 1841–1852 (2000).

Khanoyan, K., et al., "A 10b, 400 MS/s Glitch–Free CMOS D/A Converter," Symposium on VLSI Circuits Digest of Technical Papers, 73–76 (1999).

Wang, Fong–Jim, et al., "A Quasi–Passive CMOS Pipeline C/A Converter," IEEE, J. Solid–State Circuits, 24(6): 1752–1755 (1989).

* cited by examiner

Primary Examiner—Howard L. Williams
(74) Attorney, Agent, or Firm—Hamilton, Brook, Smith & Reynolds, P.C.

(57) ABSTRACT

A digital-to-analog converter (DAC) with high linearity includes a switched capacitor amplifier removably coupled to a capacitor array. The result of the conversion by the capacitor array is sampled by the switched capacitor amplifier directly from the capacitor in the most significant cell in the array. The switched capacitor amplifier includes a memory capacitor and a feedback capacitor. The memory capacitor provides the initial output voltage corresponding to the result of the conversion when coupled to the capacitor array and stores the output voltage while the feedback capacitor is reset.

19 Claims, 8 Drawing Sheets

HIGH LINEARITY DIGITAL-TO-ANALOG CONVERTER

RELATED APPLICATION

This application claims the benefit of U.S. Provisional Application No. 60/389,076, filed on Jun. 13, 2002. The entire teachings of the above application are incorporated herein by reference.

BACKGROUND OF THE INVENTION

A digital-to-analog converter (DAC) converts a digital input signal to an analog output signal. The digital input signal is represented by N-bits each of which is set to one of two states (0 or 1). The analog output signal can have any value in a continuous range.

The performance of the DAC is based on linearity and accuracy. Linearity of the DAC is a measure of the precision of the conversion. In an ideal DAC, equal increments in the digital input correspond to equal increments in the analog output value. For example, for a DAC having a 3-bit digital input signal, there are $(2^3)=8$ increments. Thus, with a range of 1V, the output voltage should change by ⅛V for each one bit change in the digital input signal. Linearity errors contribute to the accuracy of the converter, that is, the difference between the actual analog voltage and the ideal analog voltage.

FIG. 1 is a block diagram of a prior art switched capacitor digital-to-analog converter ("DAC") 100. The DAC includes a switch capacitor array 102, a sampling capacitor 104 and a charge-to-voltage buffer 106.

The DAC receives a digital input that can be represented by a set of N bits $\{b_0\ b_1\ b_2 \ldots b_{N-1}\}$. The least significant bit (LSB) of the digital input is represented by $b_0$ and the most significant bit (MSB) is represented by $b_{N-1}$. $V_{ref1}$ and $V_{ref2}$ are two reference (DC) voltage levels.

The switch capacitor array 102 includes an initializing cell and a cell for each bit in the digital input $b_{N-1}$-$b_0$. The state (0 or 1) of a bit of the digital input charges a capacitor in the respective cell in the switch capacitor array 102 to one of two reference voltages $V_{ref1}$, $V_{ref2}$. Switches, driven by a non-overlapping three phase clock (Φ1, Φ2, Φ3), force charge to move through the cells in the switch capacitor array from the cell corresponding to the least significant bit ($b_0$) of the digital input to the cell corresponding to the most significant bit ($b_{n-1}$). The accumulated charge of the capacitor corresponding to the most significant bit of the digital input corresponds to the final charge. This accumulated charge is sampled by the sampling capacitor 104 and converted to an output voltage $V_{out}$ by the charge-to-voltage buffer 106.

FIG. 2 is a circuit diagram of the prior art switch capacitor array circuit 100 shown in FIG. 1. A non-overlapping three-phase clock (Φ1, Φ2, Φ3) controls the operation of the DAC. Each switch is labeled with the phase of the clock that controls the switch. The switch is closed during the controlling phase.

Three switch capacitor cells of the switch capacitor array 102 and the initializing cell are shown. The initializing cell includes a charge switch $S_c$, a transfer switch $S_T$ and an initializing capacitor $C_i$. Each switch capacitor cell includes a capacitor C and three switches (a charge switch $S_C$, a reference switch $S_R$ and a transfer switch $S_T$). The reference switch $S_R$ is set to one of the two reference voltages ($V_{ref1}$, $V_{ref2}$) dependent on the state of the respective bit of the digital input.

Each switch capacitor cell is charged to the selected reference voltage while the charge switch $S_c$ is closed. The stored charge is transferred to the next most significant switch capacitor cell in the array while the transfer switch $S_T$ is closed.

Referring to the switch capacitor cell for the Least Significant bit (LSB) $b_0$, during phase Φ1, the charge switch in the $b_0$ cell is closed to charge the capacitor C to $V_{ref1}$ or $V_{ref1}$, depending on the value of $b_0$ and thus the state of switch $S_R$. In the example shown, $b_o=1$, so capacitor C is charged to $V_{ref1}$. During phase Φ2, the transfer switch in the initializing cell is closed to transfer the charge stored in the initializing capacitor to the $b_0$ cell. During phase Φ3, the transfer switch in the $b_0$ cell is closed to transfer the combined charge (initializing cell and $b_0$ cell) to the switch capacitor cell for the next significant bit, $b_1$. Thus, the charge is accumulated by combining charge from adjacent cells and transferring the accumulated charge to the cell corresponding to the next most significant bit.

The charge-to-voltage buffer 106 is a differential amplifier 200 configured in single-ended mode with capacitor feedback $C_F$ between the inverting input and the output. During phase Φ2, the charge switch $S_C$ for the sampling capacitor $C_S$ is closed, the sampling capacitor $C_S$ is pre-charged to $V_{ref1}$ while the differential amplifier holds the prior output voltage. During phase Φ3, the charge stored in the MSB switch capacitor cell and the charge resulting from the digital-to-analog conversion is shared with the fixed charge stored in the sampling capacitor $C_S$. The sampling capacitor $C_S$ is not connected to the differential amplifier. Also, during phase Φ3, a path to ground is provided from the non-inverting input of the differential amplifier through switch $S_G$ and the feedback $C_F$ capacitor is reset, yielding a zero output voltage $V_{out}$. Finally, during phase Φ1 the charge stored into the sampling capacitor $C_S$ is transferred into the feedback capacitor $C_F$.

The linearity of the DAC is limited by mismatch in the capacitors in each cell in the switch capacitor array, stray capacitance and the slew-rate performance of the differential amplifier.

Any mismatch in the capacitors in each cell affects the charge redistribution phase between adjacent cells and thus affects the linearity. To limit linearity problems due to mismatch in capacitors, the sampling capacitor must be selected so that the same loading and neighboring conditions present in other cells of the capacitor array are recreated for the last (MSB) cell, before the amplification is performed. Also, stray capacitance in parallel with the sampling capacitor is introduced by the switch $S_c$ connected to the sampling capacitor. The value of this stray capacitance is dependent on the voltage $V_{in}$ across the sampling capacitor $C_S$ at the end of phase Φ3.

The charge sharing between the sampling capacitor $C_S$ and the capacitor C in the MSB cell halves the final voltage to be amplified. This reduces the signal-to-noise ratio of the output voltage by 3 dB compared to the case in which there is no voltage reduction.

The slew rate of a differential amplifier is the maximum rate of output voltage change which is the maximum charging current divided by the capacitance. The differential amplifier output and the feedback capacitors are always reset to zero during phase Φ3. Therefore, the output voltage swings from zero up to the converted value during phase Φ1 and then back down to zero during phase Φ3. Thus, the output of the differential amplifier is slew rate limited during phase Φ1. The slew rate introduces harmonic distortion in the analog output spectrum.

SUMMARY OF THE INVENTION

A digital to analog converter with high linearity, low slew rate and high signal to noise ratio is presented. The digital to analog converter includes a capacitor array removably coupled to a switched capacitor amplifier. The result of the digital analog conversion in the capacitor array is provided directly to the amplifier from the capacitor in the cell corresponding to the most significant bit in the capacitor cell. This results in a high signal to noise ratio because the result of the conversion is not halved. The slew rate is reduced through the use of a memory capacitor which provides the initial output voltage and stores the output voltage while a feedback capacitor is reset.

The digital to analog converter includes a capacitor array and a switched capacitor amplifier. The switched capacitor amplifier includes a feedback capacitor; and a memory capacitor removably coupled to the output of the capacitor array. The output of the memory capacitor is charged to the output voltage of the capacitor array. The memory capacitor stores the output voltage while the feedback capacitor is reset and the memory capacitor provides the initial output voltage when coupled to the capacitor array.

The capacitor array includes a cell for each bit in a digital input signal, each cell includes a cell capacitor. The cell capacitor in the cell corresponding to the most significant bit of the digital input is removably coupled to the feedback capacitor and the memory capacitor in the switched capacitor array to charge the feedback capacitor and the memory capacitor to the converted value.

Stray capacitance is discharged by removably coupling the cell capacitor in the most significant bit cell to ground. The feedback capacitor is discharged by coupling both plates of the feedback capacitor to ground.

Further improvement in linearity may be achieved by including a pair of switches in parallel between the bottom plate of each cell capacitor and ground to provide loading conditions substantially matching the cell corresponding to the most significant bit. One of the switches is held open and the other switch is held closed.

A pair of switches may also be added to an initializing cell in the capacitor to further increase linearity, the pair of switches are coupled in parallel between the bottom plate of the initializing capacitor and ground. Another switch may be coupled between the top plate of the initializing capacitor and ground.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 3:
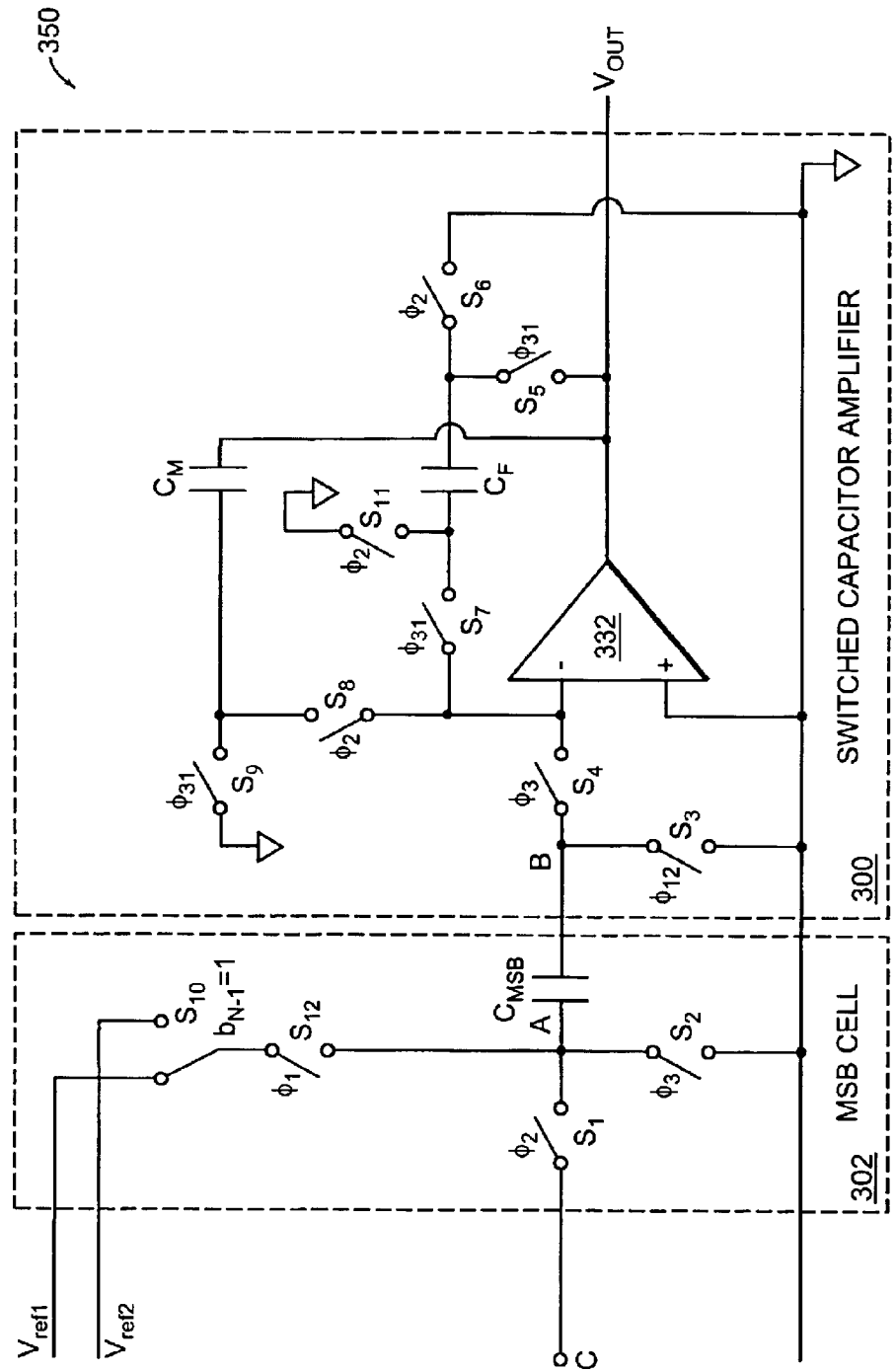
FIG. 3 is a schematic of a capacitive digital-to-analog converter according to the principles of the present invention.

FIG. 3 is a schematic of a capacitive digital-to-analog converter (DAC) 350 according to the principles of the present invention. The DAC 350 converts an N-bit digital input $\{b_0\ b_1\ b_2 \ldots b_{N-1}\}$ to an analog output signal $V_{out}$. The least significant bit (LSB) of the N-bit digital input is represented by $b_0$ and the most significant bit (MSB) is represented by $b_{N-1}$.

The DAC 350 includes a passive capacitor array and a switched capacitor amplifier 300. The passive capacitor array includes one cell for each bit of the N-bit digital input. Only the MSB cell 302 of the passive capacitor array corresponding to bit $b_{N-1}$ of an N-bit digital input is shown in FIG. 3. The passive capacitor array cells corresponding to the other bits of the N-bit digital input are similar to the passive capacitor array cells described in conjunction with the prior art DAC shown in FIG. 2. The MSB cell 302 completes the digital to analog data conversion of the N-bit digital input by a charge sharing operation through transfer switch S1 with the other cells of the passive capacitive array.

The switched capacitor amplifier 300 includes a differential amplifier 332 configured in single-ended mode with switched capacitor feedback between the inverting input and the output. The switched capacitor feedback includes a memory capacitor $C_M$ and a feedback capacitor $C_F$. The feedback path also includes switches controlled by a non-overlapping three phase clock ($\Phi 1$, $\Phi 2$, $\Phi 3$) to reduce slew-rate-induced harmonic distortion.

The MSB cell 302 in the passive capacitor array includes a MSB cell capacitor $C_{MSB}$ and four switches (a charge switch S12, a transfer switch S1, a reference voltage switch S10, and a reset switch S2). The three phases of the clock ($\Phi 1$, $\Phi 2$, $\Phi 3$) control the switches. Each switch is labeled with the respective controlling phase.

Those skilled in the art will recognize that some of the phases driving the switches coupled to the bottom plates of the capacitors can be suitably delayed to deal with charge injection using the well-known bottom plate sampling technique.

In an alternate embodiment, the reference switches $S_R$ connecting the top plates of the capacitors in the array to suitable reference voltages, can be combined with the corresponding charge switch $S_C$ driven by the clock phases in a single switch through the use of suitable logic signals.

Figure 4:
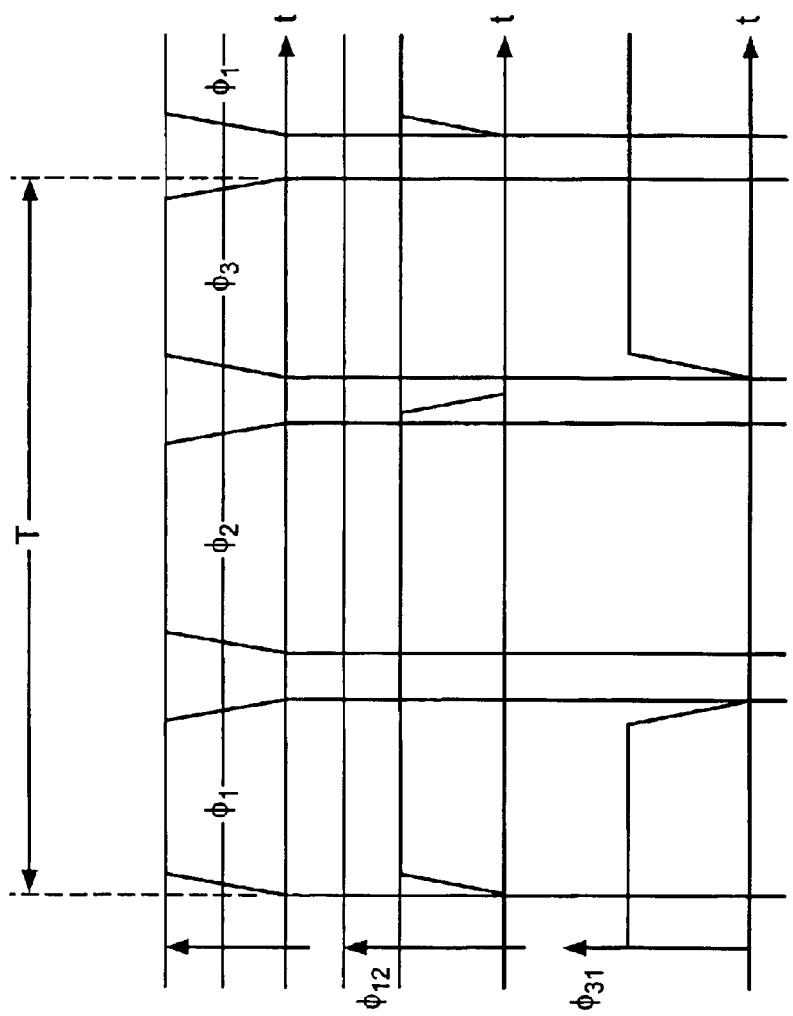
FIG. 4 illustrates the clock phases used to control the switches of the digital-to-analog converter shown in FIG. 3.

FIG. 4 illustrates the clock phases used to control the switches of the DAC 350 shown in FIG. 3. The three phases ($\Phi 1$, $\Phi 2$, $\Phi 3$) can be provided by three clocks that are phase shifted from each other by a third of a common clock period. Additional phases ($\Phi 12$, $\Phi 13$) result from combining the other three phases ($\Phi 1$, $\Phi 2$, $\Phi 3$). The phases control when the switches are closed. For example, switches controlled by phase $\Phi 1$ are closed during phase $\Phi 1$ and switches controlled by phase Φ12 are closed during phase Φ1 and phase Φ2. Clock generators used for generating phase-shifted clocks are well-known to those skilled in the art.

FIGS. 5A–B, 6A–B and 7 illustrate the behavior of the circuit shown in FIG. 3. FIGS. 5a–b, 6a–b and 7 will be described in conjunction with FIG. 3.

Returning to FIG. 3, the reference voltage switch S10 is coupled to one of two reference direct current ("DC") voltage levels ($V_{ref1}$, $V_{ref2}$) dependent on the state of the MSB in the N-bit digital input.

The switched capacitor amplifier 300 and the MSB cell 302 of the passive capacitor array are isolated during phase Φ1 because switch S4 is open. FIG. 5A illustrates the behavior of the MSB cell 302 and FIG. 5B illustrates the behavior of the switched capacitor amplifier 300 during phase Φ1.

Referring to FIG. 5A, during phase Φ1, charge switch S12 in the MSB cell 302 is closed to pre-charge the MSB cell capacitor $C_{MSB}$. The transfer switch S1 (FIG. 3) and the reset switch S2 are open. While the charge switch S12 is closed, the MSB cell capacitor $C_{MSB}$ is coupled to $V_{ref1}$ or $V_{ref2}$ through the voltage reference switch 304. While switch S12 and switch S3 are closed there is a current path from the source voltage ($V_{ref1}$, $V_{ref2}$) through the MSB cell capacitor to ground. The MSB cell capacitor $C_{MSB}$ is charged to $V_{ref1}$ if bn−1=1, and charged to $V_{ref2}$ if bn−1=0. In the embodiment shown, with the MSB set to '1', the MSB capacitor $C_{MSB}$ is charged to $V_{ref1}$. The voltage across the capacitor $C_{MSB}$. At the end of Φ1, the voltage at node A is the same as the source voltage.

Figure 5B:
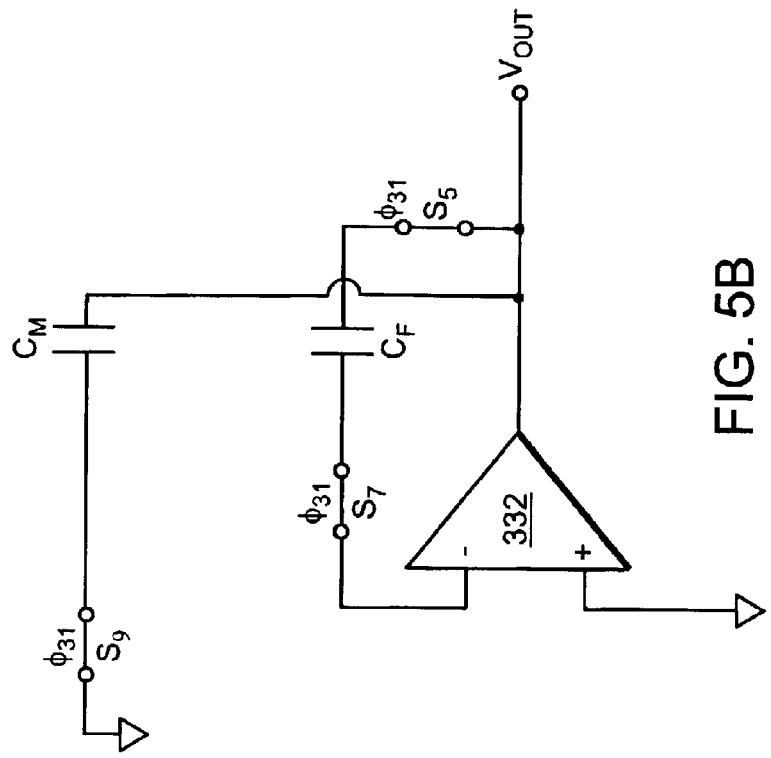
FIGS. 5A and 5B depict the behavior of the circuit shown in FIG. 3 during phase $\Phi 3$ of the clock.
Figure 5A:
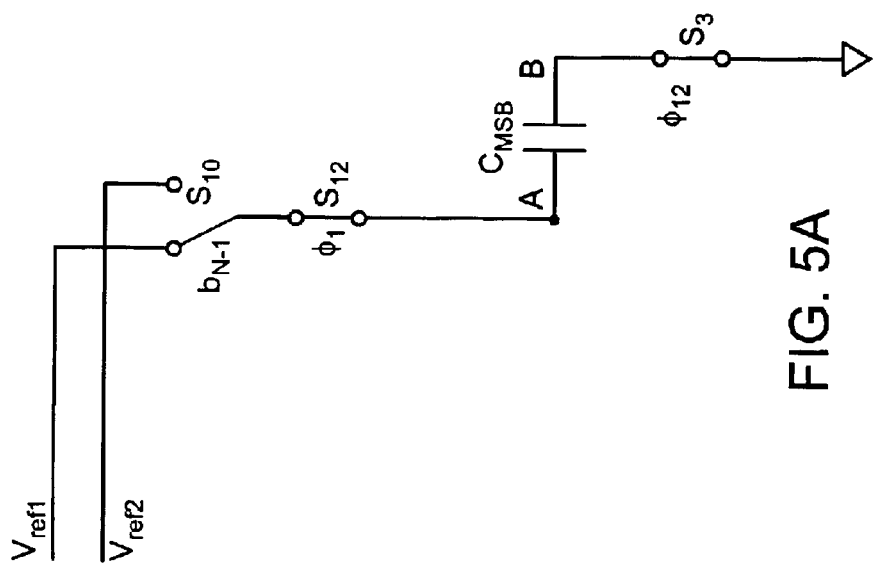

Referring to FIG. 5B, during phase Φ1, the last voltage level output on $V_{out}$ by the switched capacitor amplifier 300 is held by the feedback capacitor $C_F$ and the memory capacitor $C_M$ and it is available at the output of the differential amplifier. Switches S7, S5 and S9 are closed. The feedback capacitor $C_F$ is coupled between the inverting input and the output of the differential amplifier S11 through closed switches S7, S5. The memory capacitor $C_M$ is coupled to ground through closed switch S9.

Figure 6B:
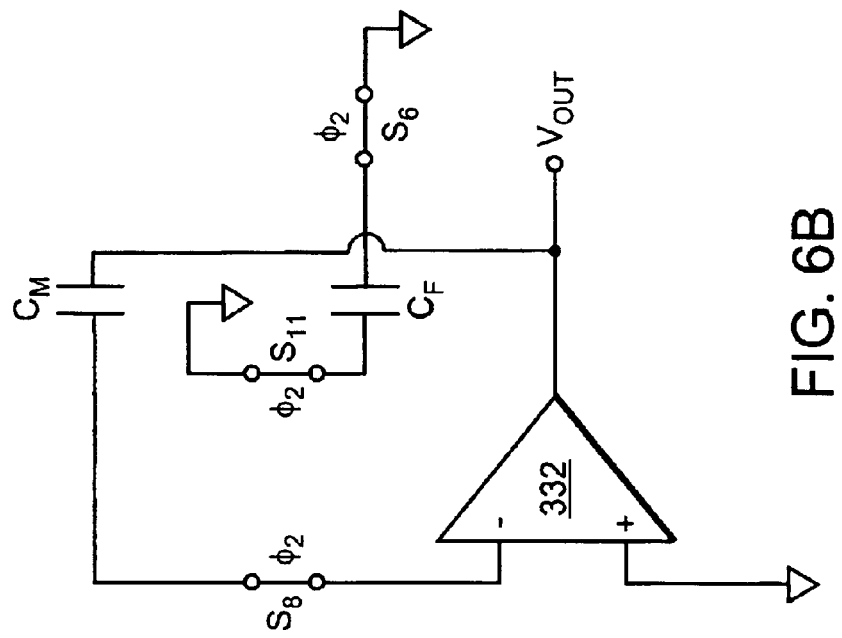
FIGS. 6A and 6B depict the behavior of the circuit shown in FIG. 3 during phase $\Phi 2$ of the clock.
Figure 6A:
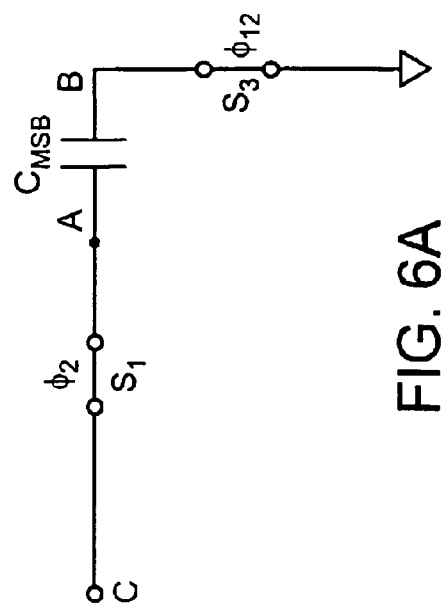

FIGS. 6A and 6B illustrate the behavior of the circuit shown in FIG. 3 during phase Φ2. The switched capacitor amplifier 300 and the MSB cell 302 of the passive capacitor array are isolated during phase Φ2 because switch S4 is open. Referring to FIG. 6A, the transfer switch S1 is closed completing the digital-to-analog conversion by allowing the MSB cell capacitor $C_{MSB}$ to share its charge with the other cells in the passive capacitor array through node C. The voltage $V_{in}$ held on the MSB cell capacitor $C_{MSB}$ at the end of phase Φ2 represents the result of the digital-to-analog conversion.

Referring to FIG. 6B, switch S11, switch S6 and switch S8 are closed. The voltage on feedback capacitor $C_F$ is discharged while it is disconnected from the feedback loop of differential amplifier 332 and each of the plates of the capacitor is coupled to ground through a respective closed switch S11, S6. The memory capacitor $C_M$ is coupled between the output and the inverting input of the differential amplifier 332 to hold the output of the differential amplifier 332 $V_{out}$ at the voltage corresponding to the previous digital input.

Figure 7:
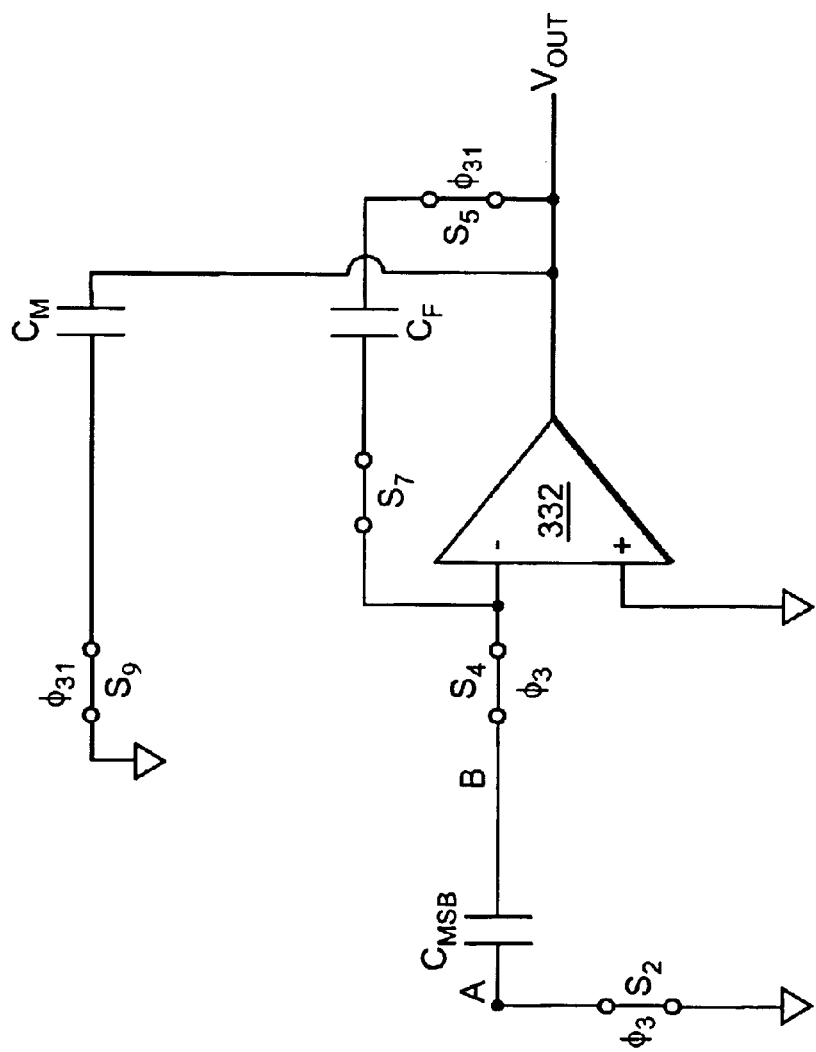
FIG. 7 depicts the behavior of the circuit shown in FIG. 3 during phase $\Phi 3$ of the clock.

FIG. 7 illustrates the behavior of the circuit shown in FIG. 3 during phase Φ3. The switched capacitor amplifier 300 and the MSB cell 302 of the passive capacitor array are coupled during phase Φ3 through closed switch S4. Switches S9, S7 and S5 are also closed. The feedback capacitor $C_F$ is coupled between the inverting input and the output of the differential amplifier 332, and the memory capacitor $C_F$ is coupled to ground through switch S9. The bottom plate of the MSB cell capacitor is connected to ground through closed switch S2.

The MSB cell capacitor $C_{MSB}$ is discharged onto the virtual ground of the differential amplifier, while the feedback capacitor $C_F$ is charged by the same amount of charge. Ideally, the steady state value of $V_{out}$ at the end is $V_{out}=(C_{MSB}/C_F) V_{in}$, yielding a voltage gain $G=V_{out}/V_{in}=C_{MSB}/C_F$. The memory capacitor $C_M$ is now charged to $V_{out}$.

Figure 1:
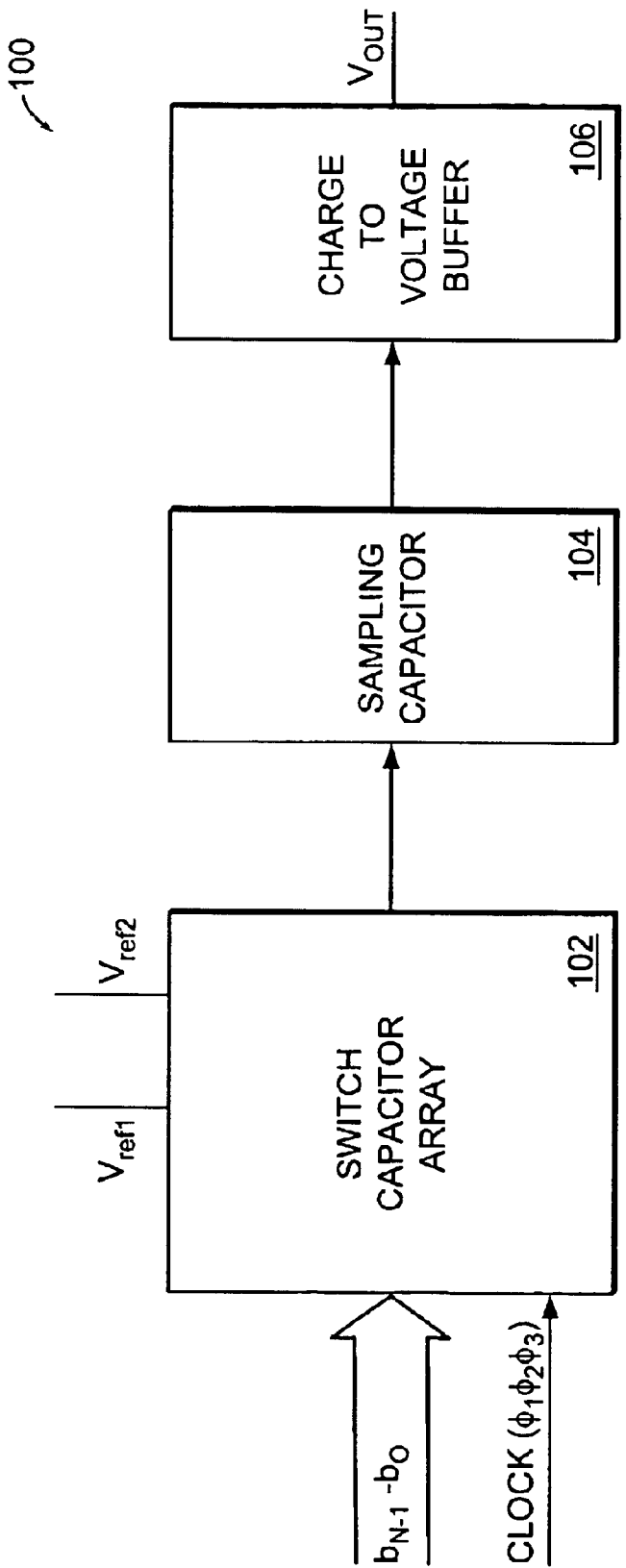
FIG. 1 is a block diagram of a prior art switched capacitor digital-to-analog converter ("DAC")
Figure 2:
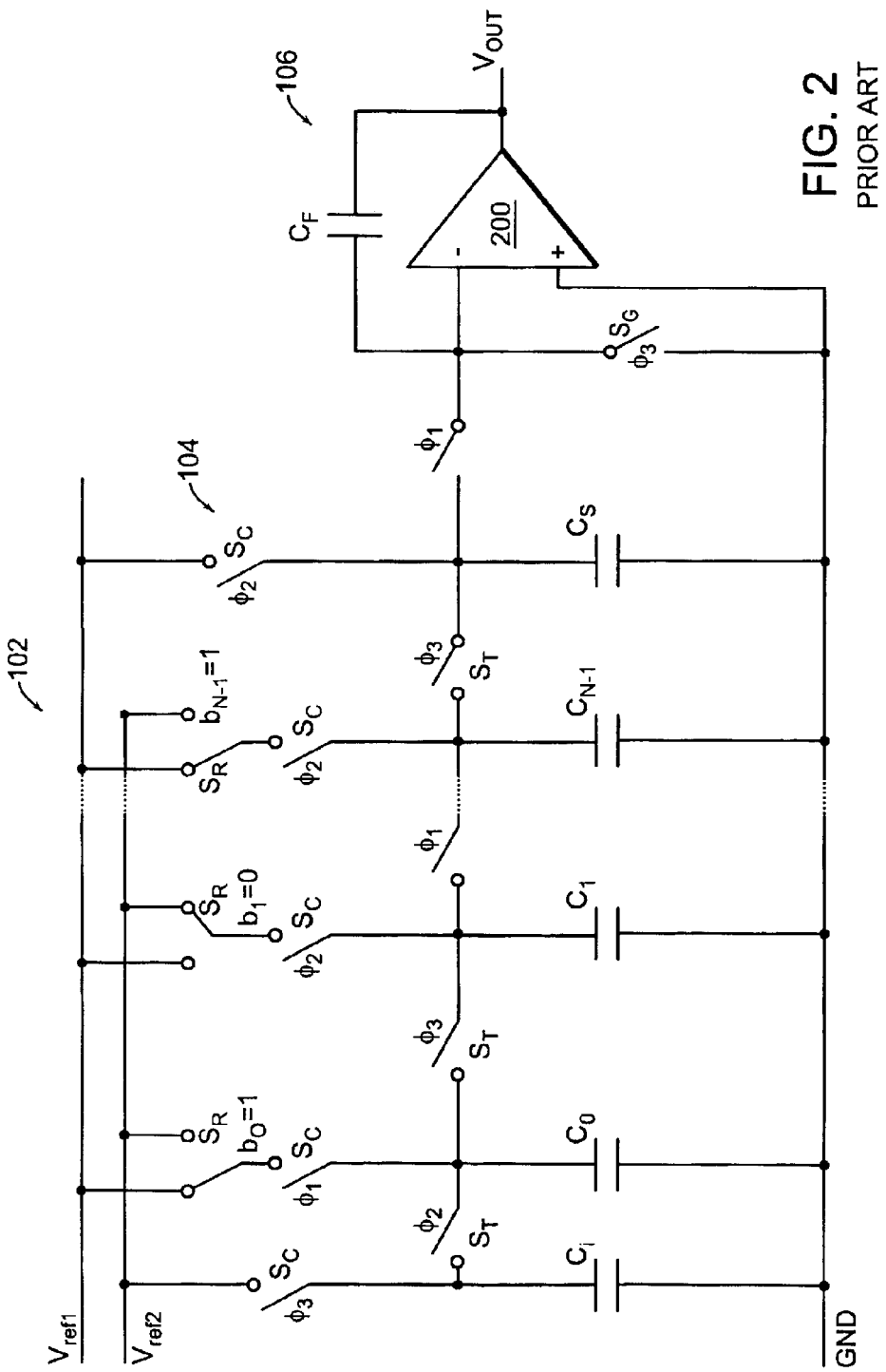
FIG. 2 is a circuit diagram of the prior art switch capacitor array circuit and the charge-to-voltage buffer shown in FIG. 1.

$C_{MSB}$ is the charge capacitor for the MSB cell and also performs the function of the sampling capacitor $C_S$, used in the prior art DAC shown in FIG. 2. Thus, the sampling capacitor used in the prior art circuit shown in FIG. 1 is not required because the MSB cell capacitor $C_{MSB}$ is used as a sampling capacitor during phase Φ3. Therefore, the output voltage from the array is not reduced before the final amplification.

In contrast to the prior art, the analog output voltage $V_{out}$ does not return to zero at every conversion period. Instead, the analog output voltage $V_{out}$ changes from the previously converted analog value stored by the memory capacitor $C_M$ to the current one during phase Φ3, and is held constant at this current value during the following two phases Φ1, Φ2. Thus, the slew-rate limitation is greatly reduced, compared to the prior art amplifier of FIG. 2, because the slew-rate mostly affects rapidly varying input digital sequences, for example, a digital input with all bits set to '0', followed by a digital input with all bits set to '1'.

The slew rate will be the same as the prior art only when the input sequence has a bandwidth equal to the Nyquist frequency. The Nyquist frequency is the maximum frequency that a DAC with sampling frequency fs can convert. When the input sequence is an alternating sequence, such as one that corresponds to converted outputs V1, −V1, V1, −V1 . . . This input sequence has a bandwidth equal to fs/2 because its period is exactly double of the DAC's sampling frequency. If an input sequence with Nyquist bandwidth is applied, the DAC's output will go from V1 down to −V1, and then up to V1, and then down to −V1. Hence there will be sharp transitions between V1 and −V1 (and up to V1 again).

When the input sequence has a bandwidth which is between zero and fs/2, the slew rate is reduced because the DAC's output only swings between closely spaced output levels, that is, from the output's prior level to the output's current level, instead of going all the way to zero before moving to the next output level. If the input sequence is a constant sequence with zero bandwidth, that is, a DC signal, which corresponds to a converted output voltage V1, the output of the DAC will not change because the prior output value is equal to the current one. Thus, the slew-rate-induced harmonic distortion of the preferred embodiment of FIG. 2 is lower than in the prior art DAC described in conjunction with FIG. 2.

Returning to FIG. 3, switches S12, S1, S2 and MSB cell capacitor $C_{MSB}$ are coupled at node A. The circuit is insensitive to stray capacitances at node A because these parasitic capacitances are discharged to a signal ground during phase Φ3 and hence do not play a role in the amplification.

The circuit shown in FIG. 3 is a single-ended circuit. However, it will be apparent to those skilled in the art that a fully differential/balanced version of this circuit can be easily made.

Figure 8:
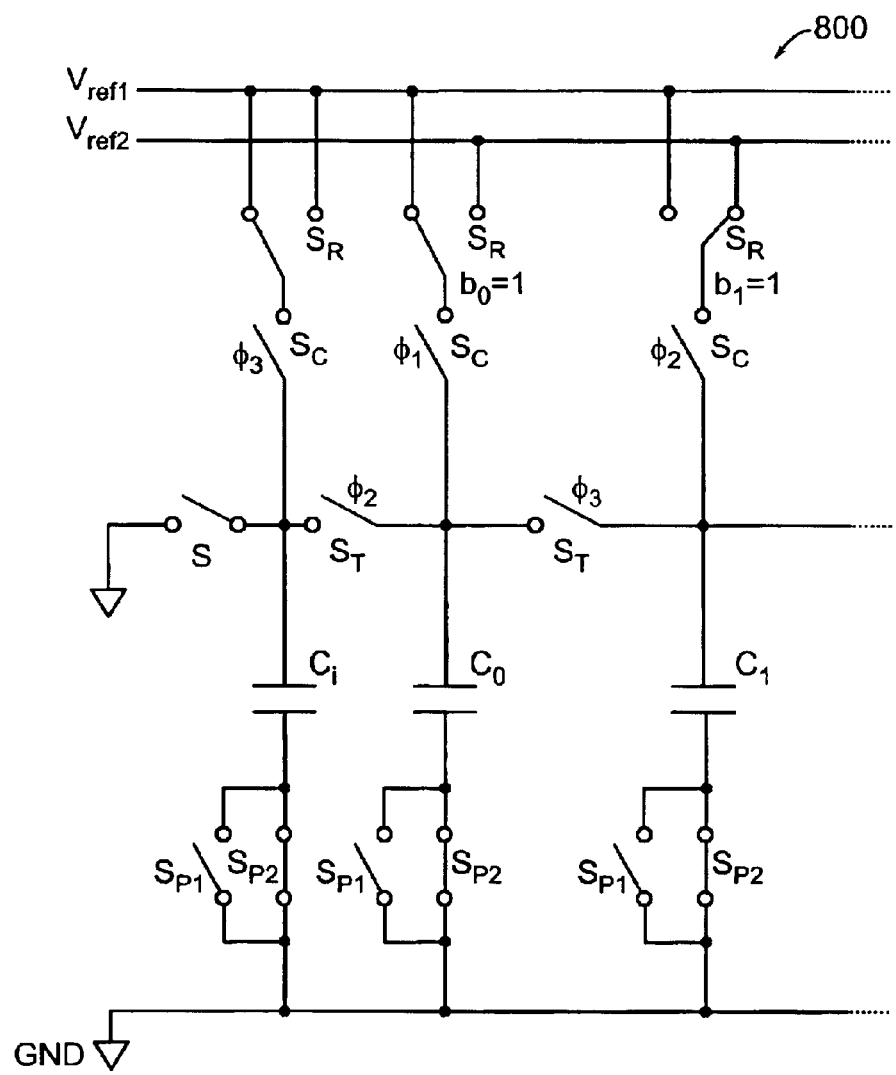
FIG. 8 is a schematic of another embodiment of a passive capacitor array that can be used with the switched capacitor amplifier shown in FIG. 3.

FIG. 8 illustrates another embodiment of a passive capacitor array 800 that can be used with the switched capacitor amplifier 300 shown in FIG. 3. An additional pair of switches $S_{P1}$, $S_{P2}$ is coupled between the bottom plate terminal of each capacitor C and the signal ground in each cell in the passive capacitor array. One of the switches $S_{p1}$, in the pair of switches is always open and the other switch $S_{p2}$ is always closed. The pair of switches match in both size and layout the switches S4 and S3 of the switched capacitor amplifier 300 of FIG. 3.

The addition of the pair of switches to each cell in the passive capacitor array ensures a better match between the MSB cell and the other cells of the array because the same loading and neighboring conditions are present during the active phases of the digital-to-analog conversion.

In addition, another switch S can be added to the initializing cell, preceding the LSB cell. The switch S is open at all times such that each cell in the array is matched.

While this invention has been particularly shown and described with references to preferred embodiments thereof, it will be understood by those skilled in the art that various changes in form and details may be made therein without departing from the scope of the invention encompassed by the appended claims.

What is claimed is:

1. A digital-to-analog converter comprising:
   a capacitor array; and
   a switched capacitor amplifier, the switched capacitor amplifier comprising:
      a feedback capacitor; and
      a memory capacitor removably coupled to the output of the capacitor array, the output of the memory capacitor being charged to the output voltage of the capacitor array, the memory capacitor storing the output voltage while the feedback capacitor is reset and the memory capacitor providing the initial output voltage when coupled to the capacitor array.

2. The digital-to-analog converter of claim 1 wherein the capacitor array comprises:
   a cell for each bit in a digital input signal, each cell including a cell capacitor, the cell capacitor in the cell corresponding to the most significant bit of the digital input being removably coupled to the feedback capacitor and the memory capacitor.

3. The digital-to-analog converter of claim 2 wherein stray capacitance is discharged by removably coupling the cell capacitor in the most significant bit cell to ground.

4. The digital-to-analog converter of claim 2 wherein the feedback capacitor is discharged by coupling both plates of the feedback capacitor to ground.

5. The digital-to-analog converter of claim 2 wherein each cell further includes:
   a pair of switches coupled in parallel between the bottom plate of a cell capacitor and ground to provide loading conditions substantially matching the cell corresponding to the most significant bit.

6. The digital-to-analog converter of claim 5 wherein one of the switches is held open and the other switch is held closed.

7. The digital-to-analog converter of claim 2 wherein the capacitor array further comprises:
   an initializing cell, the initializing cell including:
      an initializing capacitor;
      a pair of switches coupled in parallel between the bottom plate of the initializing capacitor and ground; and
      another switch coupled between the top plate of the initializing capacitor and ground.

8. A method for converting a digital signal to an analog signal comprising:
   charging a memory capacitor to the output voltage of a capacitor array while the memory capacitor is removably coupled to the capacitor array, the memory capacitor providing the initial output voltage when coupled to the capacitor array; and
   storing the output voltage while a feedback capacitor in the capacitor switched amplifier is reset.

9. The method of claim 8 comprising:
   including a cell in the capacitor array for each bit in a digital input signal, each cell including a cell capacitor, the cell capacitor in the cell corresponding to the most significant bit of the digital input removably coupled to the feedback capacitor and the memory capacitor.

10. The method of claim 9 further comprising:
    discharging stray capacitance by removably coupling the cell capacitor in the most significant bit cell to ground.

11. The method of claim 9 further comprising:
    discharging the feedback capacitor by coupling both plates of the feedback capacitor to ground.

12. The method of claim 9 further comprising:
    substantially matching the loading conditions of the cell corresponding to the most significant bit by coupling a pair of switches in parallel between the bottom plate of the cell capacitor and ground.

13. The method of claim 12 wherein one of the switches is held open and the other switch is held closed.

14. The method of claim 13 further comprising:
    matching capacitance of an initializing cell in the cell array by coupling a pair of switches in parallel between the bottom plate of the initializing capacitor and ground and coupling another switch between the top plate of the initializing capacitor and ground.

15. A digital to analog converter comprising:
    means for charging a memory capacitor to the output voltage of a capacitor array while the memory capacitor is removably coupled to the capacitor array, the memory capacitor providing the initial output voltage when coupled to the capacitor array; and
    means for storing the output voltage while a feedback capacitor in the capacitor switched amplifier is reset.

16. A digital-to-analog converter comprising:
    a switched capacitor amplifier;
    a capacitor array including a cell for each bit in a digital input signal, each cell including a cell capacitor, the cell capacitor in the cell corresponding to the most significant bit of the digital input being removably coupled to the switched capacitor amplifier, and wherein each cell further includes:
       a pair of switches coupled in parallel between the bottom plate of a cell capacitor and oround to provide loading conditions substantially matching the cell corresponding to the most significant bit.

17. The digital-to-analog converter of claim 16 wherein stray capacitance is discharged by coupling the cell capacitor in the most significant bit cell to ground.

18. The digital-to-analog converter of claim 16 wherein one of the switches is held open and the other switch is held closed.

19. The digital-to-analog converter of claim 16 wherein the capacitor array further comprises:
    an initializing cell, the initializing cell including:
       an initializing capacitor;
       a pair of switches coupled in parallel between the bottom plate of the initializing capacitor and ground; and
       another switch coupled between the top plate of the initializing capacitor and ground.

* * * * *